(12) United States Patent
Dowling et al.

(10) Patent No.: US 6,283,703 B1
(45) Date of Patent: Sep. 4, 2001

(54) AUTOMATIC CONVEYING APPARATUS FOR JEDEC CARRIER MEMBERS

(75) Inventors: James L. Dowling, Milford; Brian Blades, Concord, both of NH (US)

(73) Assignee: Laurier Incorporated, Londonberry, NH (US)

( * ) Notice: Subject to any disclaimer, the term of this patent is extended or adjusted under 35 U.S.C. 154(b) by 0 days.

(21) Appl. No.: 09/426,555

(22) Filed: Oct. 22, 1999

(51) Int. Cl.$^7$ .................................................. B65G 60/00
(52) U.S. Cl. .................................. 414/788.7; 414/788.8; 414/794.2; 414/798.1
(58) Field of Search ............................. 414/788.2, 788.7, 414/788.8, 794.2, 798, 798.1

(56) References Cited

U.S. PATENT DOCUMENTS

| | | |
|---|---|---|
| 3,289,861 | 12/1966 | Carle et al. . |
| 3,620,385 | 11/1971 | Vermeijlen et al. . |
| 4,693,659 | 9/1987 | Burke et al. . |
| 4,789,079 | 12/1988 | Kobayashi et al. ................... 221/232 |
| 5,024,593 | * 6/1991 | Hehl ............................... 414/788.7 X |
| 5,441,380 | 8/1995 | Horikawa ........................... 414/788.7 |
| 5,645,392 | * 7/1997 | Leichty et al. ................. 414/797.5 X |

FOREIGN PATENT DOCUMENTS 2 322 945    11/1974    (DE) .................................. 198/465.1

* cited by examiner

Primary Examiner—Janice L. Krizek
(74) Attorney, Agent, or Firm—Davis & Bujold, P.L.L.C.

(57) ABSTRACT

A conveying apparatus for sequentially feeding a plurality of stacked carrier members to an assembly area. The conveying apparatus comprises a first bin for storing a desired quantity of stackable carrier members and the first bin has an outlet for sequentially discharging a carrier member therefrom. A feed mechanism communicating with the outlet of the first bin, and the feed mechanism facilitating individual feeding of the carrier members, in a sequential manner, from said first bin toward the assembly area. A conveyor mechanism, communicating with the outlet of the first bin, for receiving one carrier member, fed by the feed mechanism, and for conveying the carrier member to the assembly area where a plurality of components can be either retrieved from the carrier member to manufacture a desired product or loaded on the carrier member for later manufacture of a desired product. A second bin for collecting each of the carrier members, returned by the conveyor mechanism from the assembly area, is provided and a transfer assembly for transferring each of the carrier members returned by the conveyor mechanism from the assembly area to the second bin is also provided.

15 Claims, 12 Drawing Sheets

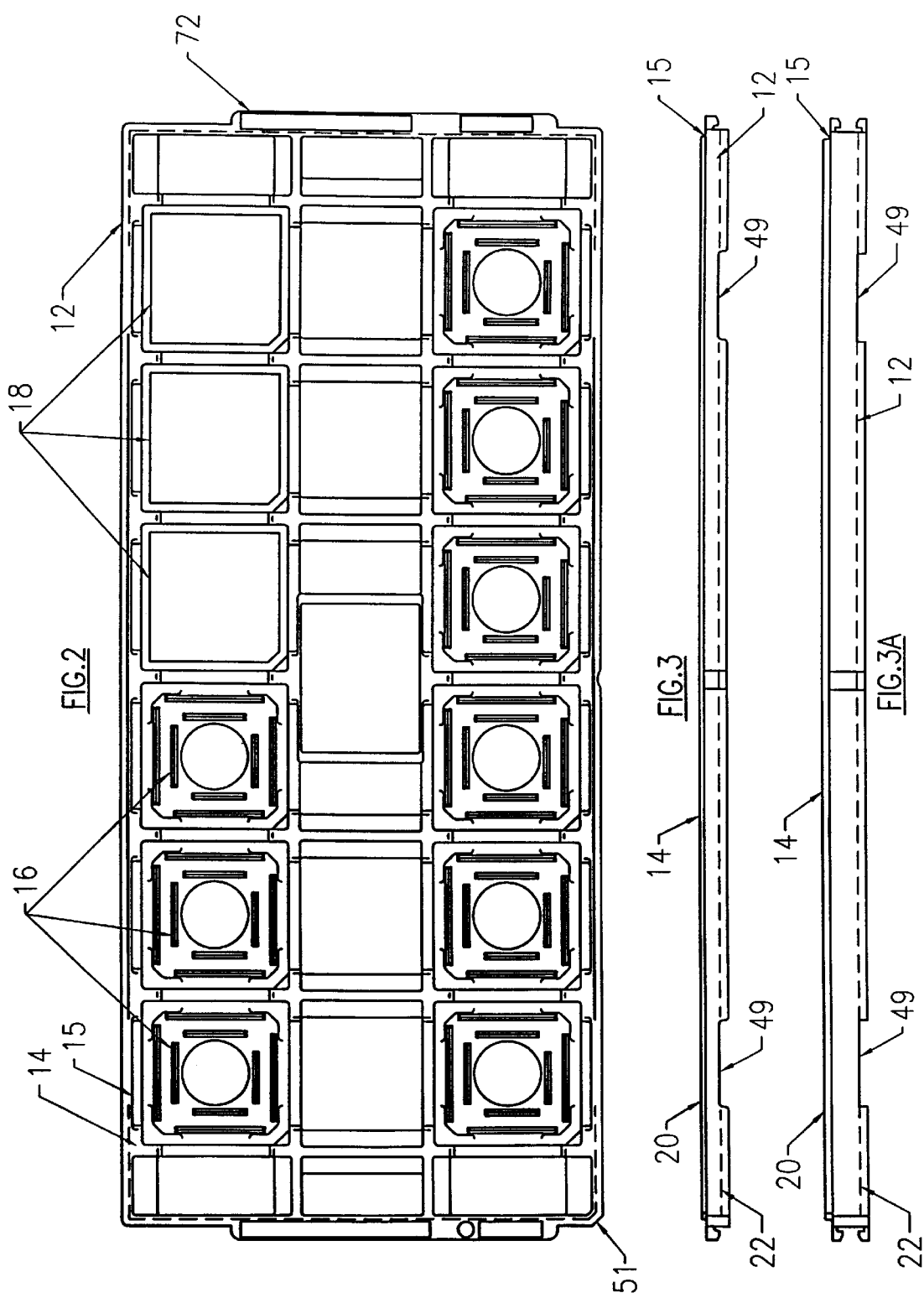

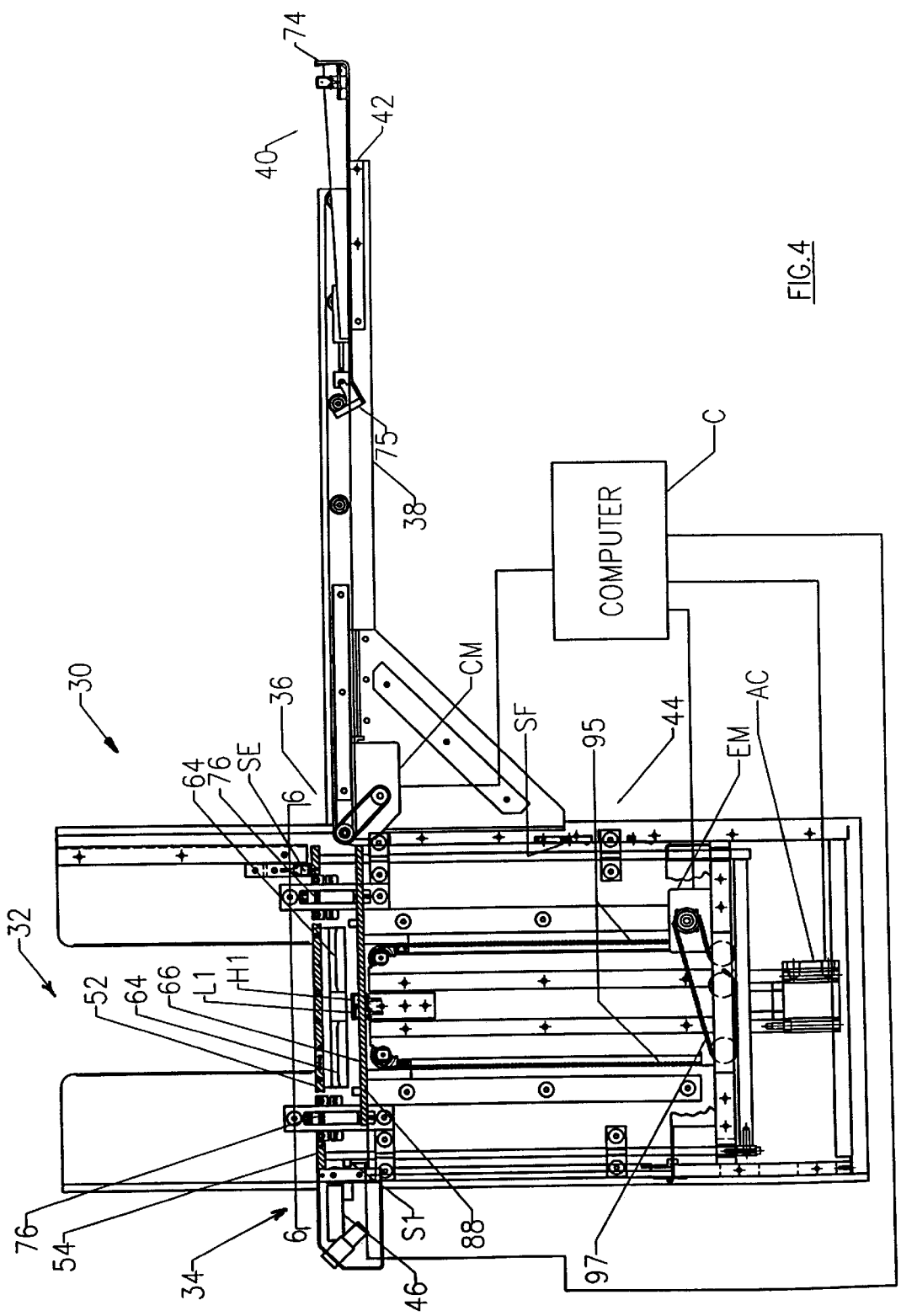

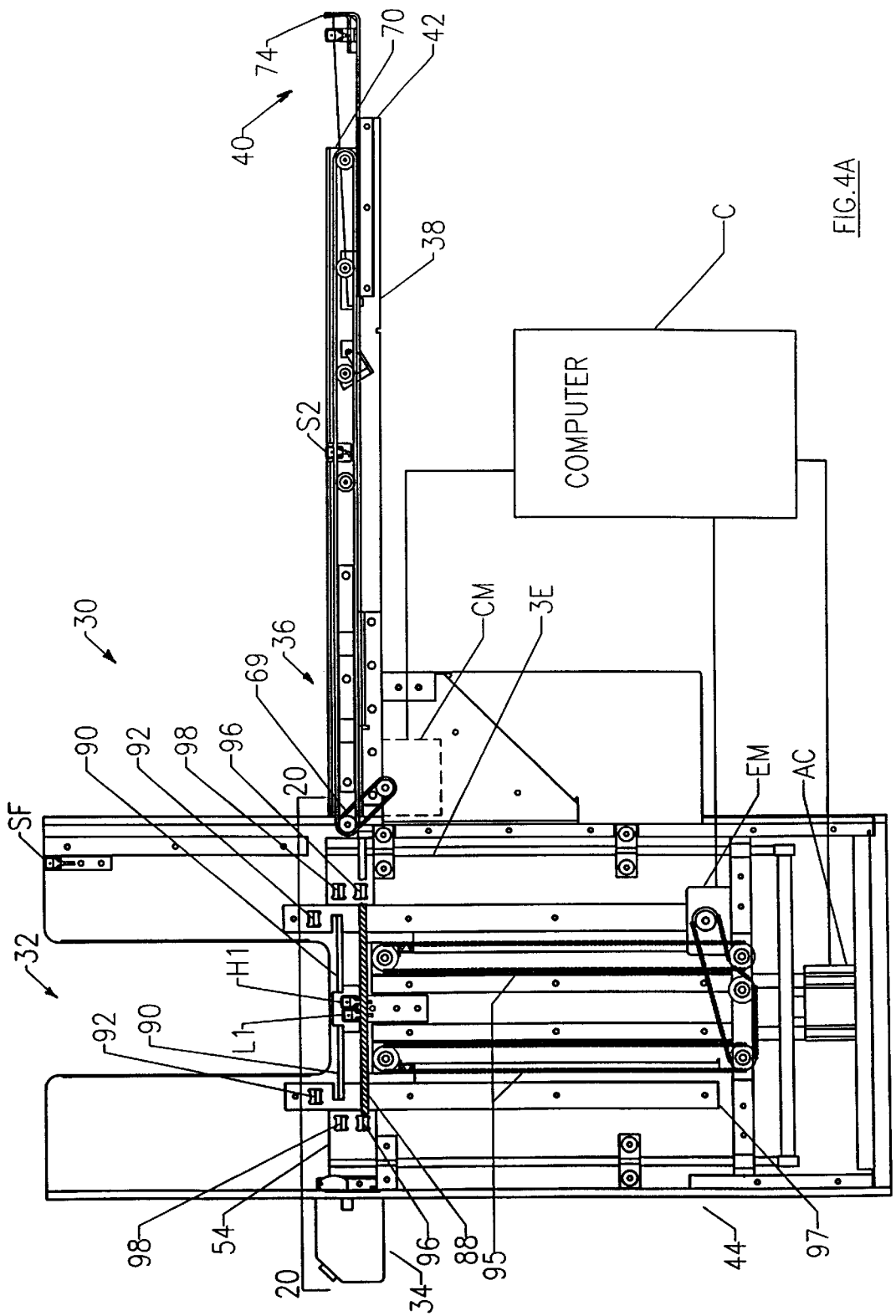

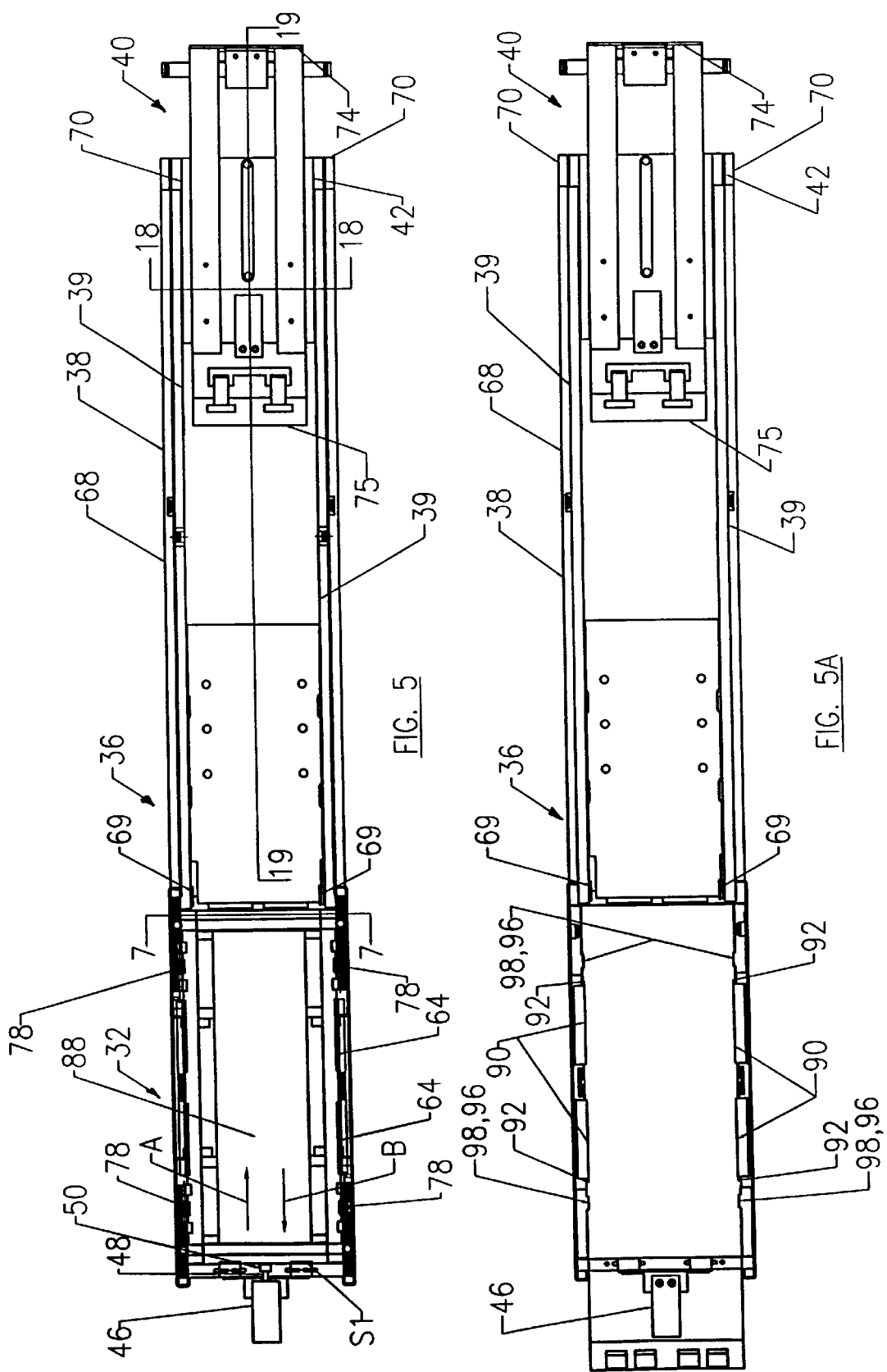

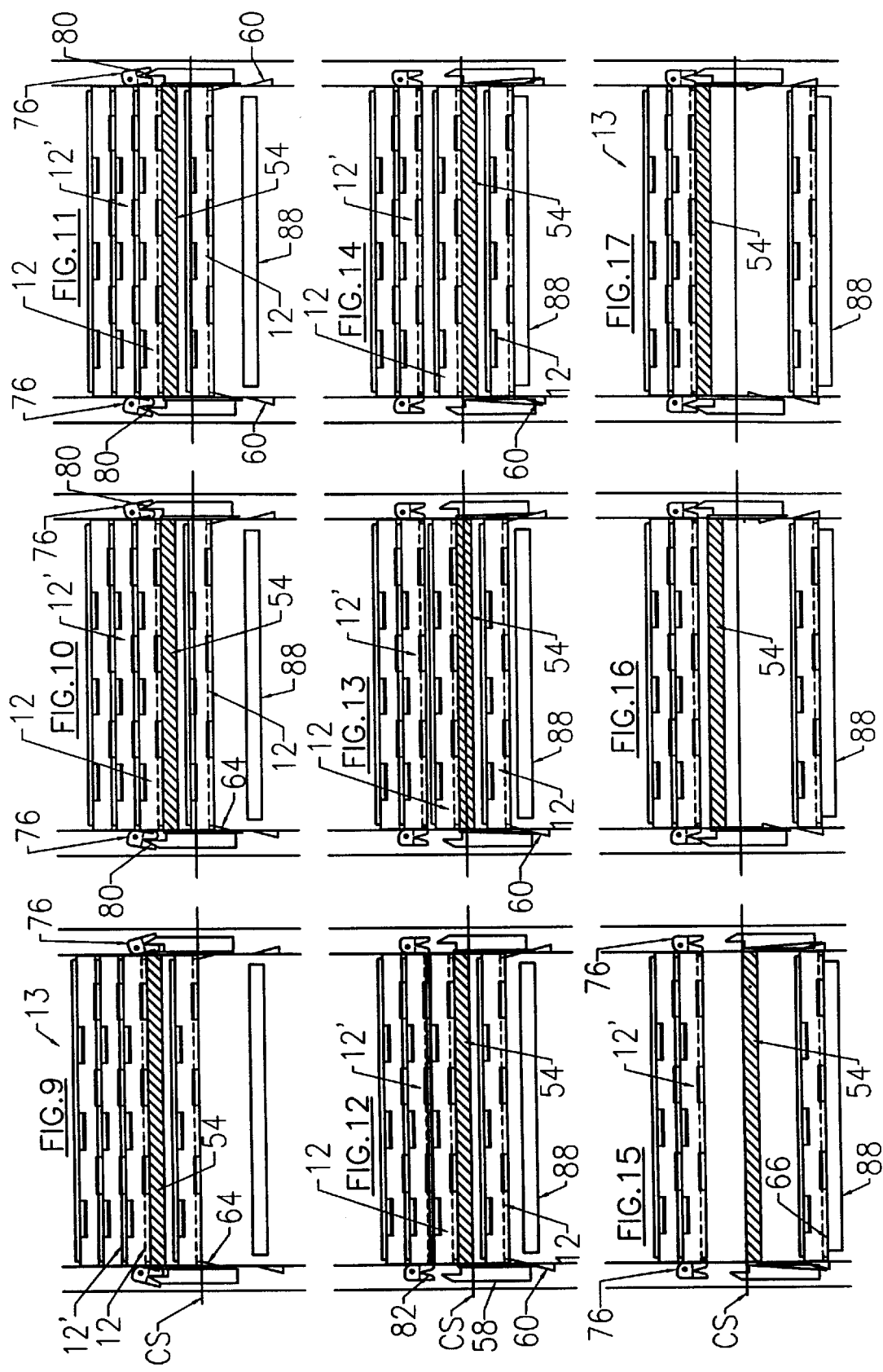

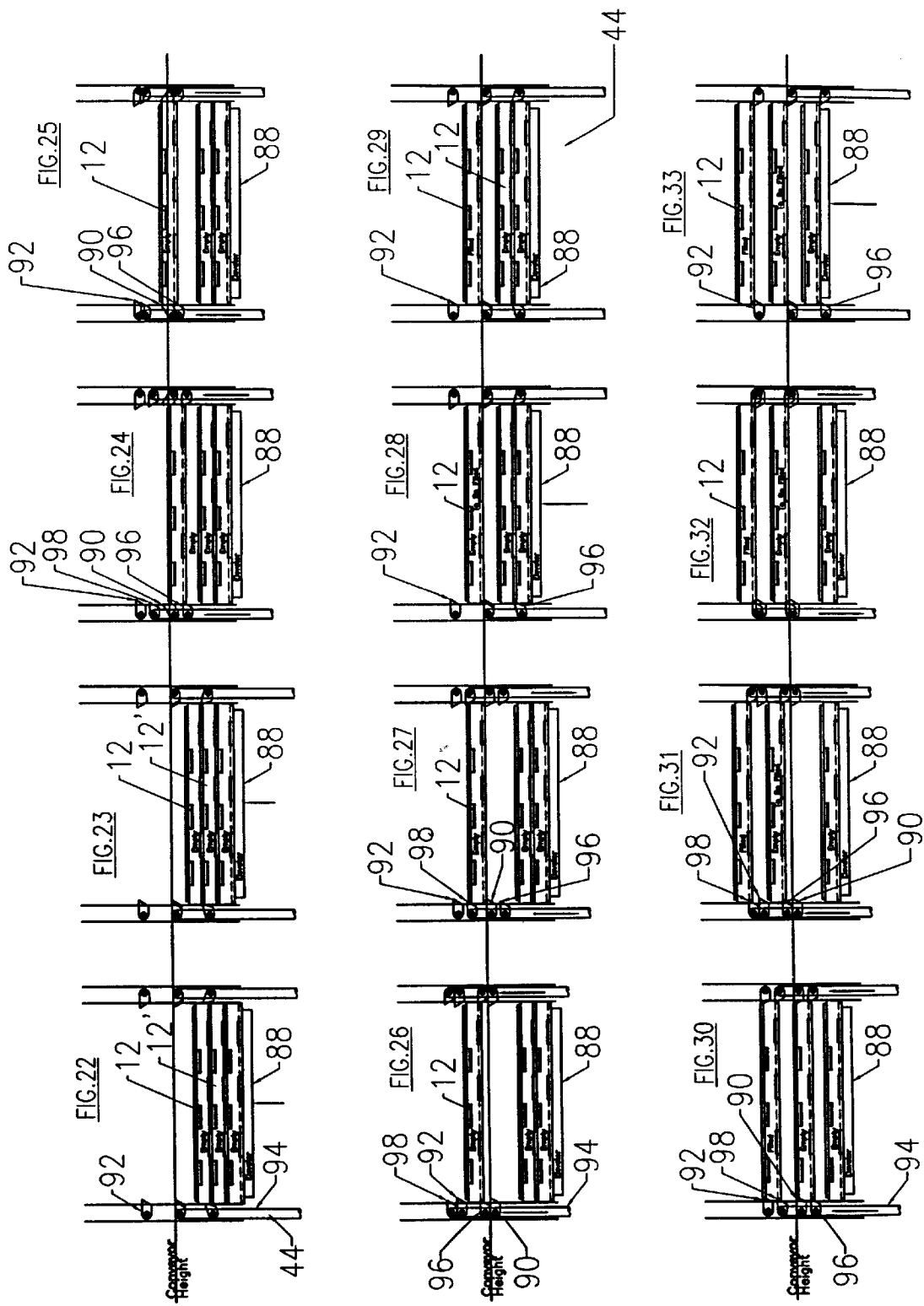

AUTOMATIC CONVEYING APPARATUS FOR JEDEC CARRIER MEMBERS

The present invention relates to a conveying apparatus for sequentially conveying a plurality of nestable or stackable JEDEC trays and, in particular, for sequentially conveying a plurality of nested JEDEC trays each containing a plurality of integrated circuit devices or some other electronic components, to an automated assembly system where the supplied components can be retrieved and used for production of various electronic end products or for conveying an empty carrier member to an assembly area where components can be loaded on said carrier member for use in later production of a desired component.

BACKGROUND OF THE INVENTION

A variety of automated assembly systems currently exist for assembling various electronic and computer components. However, all of the known prior art automated assembly systems typically work as batch cycles when retrieving components from JEDEC trays. One such automated assembly system 2 is diagrammatically shown in FIG. 1. Once all of the supplied components are assembled on the end product(s), the automated assembly system 2 must be temporarily shut down to replenish the supply of components. This is typically done by opening a side panel or door 4, of the automated assembly system 2, and replacing the emptied JEDEC tray(s) 8 with one or more fresh JEDEC trays 8, which each support additional components to be assembled into end product(s). Once a new supply of components is provided, the automated assembly system 2 then recommences operation to place the additional components, as required, and assemble the desired end product(s).

As the known prior art automated assembly systems 2 work very rapidly, the replenished supply of provided components is utilized fairly quickly, e.g. usually within a few seconds to a few minutes or so. Each time the quantity of supplied components is completely retrieved from the carrier members, the automated assembly system 2 must be temporarily interrupted or shutdown so that a new reserve of components can be supplied to the automated assembly system 2. Once the supply of components is replenished, a further batch cycle can occur. This procedure is continuously repeated throughout a work shift of each work day.

As is apparent from the above brief discussion, the known prior art automated assembly systems have a couple of associated drawbacks. In particular, such automated assembly systems are batch cycle systems rather than continuous or substantially continuous feed systems thus requiring numerous interruptions in the manufacturing process during the work shift of each work day. In addition, as a relatively bulky carrier tray 6 is sometimes utilized to support a plurality of JEDEC trays 8 carrying the supply of components to be assembled, a significant amount of important working space or area, within the interior of the automated assembly system, is utilized to accommodate the carrier members supporting the components to be assembled. Further, the automated assembly system must to be programmed to pick up components to be assembled from a plurality of different locations on the tray, rather than a single location or a relatively small number of locations, and assemble them properly on the product being manufactured by the automated assembly system.

Another problem associated with prior art automated assembly systems is that the working space or area for accessing the interior of the automated assembly systems is fairly limited. Accordingly, all of the available prior art systems are fairly cumbersome and occupy a substantial amount of working space or area adjacent the access door to the automated assembly system.

SUMMARY OF THE INVENTION

Wherefore it is an object of the present invention to overcome the aforementioned drawbacks.

A further object of the invention is to provide a conveying apparatus, for a plurality of nested carrier members such as JEDEC trays, which sequentially supplies one of the nested carrier members, either empty or carrying a plurality of components to be assembled, to an automated assembly system as required.

Another object of the invention is to provide a conveying apparatus which facilitates automatic collection of each one of the supplied carrier members, from the automated assembly system, once filled with components to be assembled or once all the supplied components carried thereby are utilized by the automated assembly system.

A still further object of the invention is to provide a conveying apparatus which occupies a minimal amount of working area within or adjacent the automated assembly system.

Yet another object of the invention is to provide a conveying apparatus in which at least the first (supply) bin and the second (collection) bin, of the feed apparatus, are readily accessible from an exterior of the automated assembly system so that a substantially continuous supply of components can be provided to the automated assembly system without any significant interruption in the manufacturing process.

A still further object of the invention is to provide a conveying apparatus which minimizes the locations where the automated assembly system must be programmed to pick up the components to be assembled during the manufacturing process or placed when loading a JEDEC tray with components for later assembly.

The present invention relates to a conveying apparatus for sequentially feeding a plurality of stacked carrier members, said conveying apparatus comprising: a first bin for storing a desired quantity of stackable carrier members, said first bin having an outlet for sequentially discharging a carrier member therefrom; a feed mechanism communicating with said outlet of said first bin, and said feed mechanism facilitating individual feeding of said carrier members, in a sequential manner, from said first bin during use; a conveyor mechanism communicating with said outlet of said first bin for receiving one carrier member, fed by said feed mechanism, and for conveying said carrier member to an assembly area where a plurality of components can be retrieved from said carrier member to manufacture a desired product or loaded on said carrier member for later manufacture of a desired product; a second bin for collecting each said carrier member returned by said conveyor mechanism from said assembly area, and said second bin having an inlet located adjacent said conveyor mechanism; and a transfer assembly for transferring carrier members from said first bin to said feed mechanism and for transferring each said carrier member, returned by said conveyor mechanism from said assembly area, to the second bin.

BRIEF DESCRIPTION OF THE DRAWINGS

The invention will now be described, by way of example, with reference to the accompanying drawings in which:

FIG. 2 is diagrammatic top plan view showing a preferred prior art carrier member for use with the present invention;

FIG. 3 is diagrammatic side elevational view of a thinnest allowable embodiment of the carrier member of FIG. 2;

FIG. 3A is a diagrammatic side elevational view of a thickest allowable embodiment of the carrier member of FIG. 2;

FIG. 4 is diagrammatic partial sectional view of a first embodiment of the conveying apparatus according to the present invention;

FIG. 4A is diagrammatic partial sectional view of a second embodiment of the conveying apparatus according to the present invention;

FIG. 5 is a diagrammatic top plan view of the conveying apparatus of FIG. 4;

FIG. 5A is a diagrammatic top plan view of the conveying apparatus of FIG. 4A;

FIGS. 8 through 17 are diagrammatic views, similar to FIG. 7, showing the feed sequence by the feed mechanism of a stacked carrier member onto the conveyor mechanism;

FIGS. 23 through 33 are diagrammatic views, similar to FIG. 21, showing the feed sequence by the feed mechanism of a stacked carrier member onto the conveyor mechanism according to the second embodiment.

DESCRIPTION OF THE PREFERRED EMBODIMENT

Figure 1:
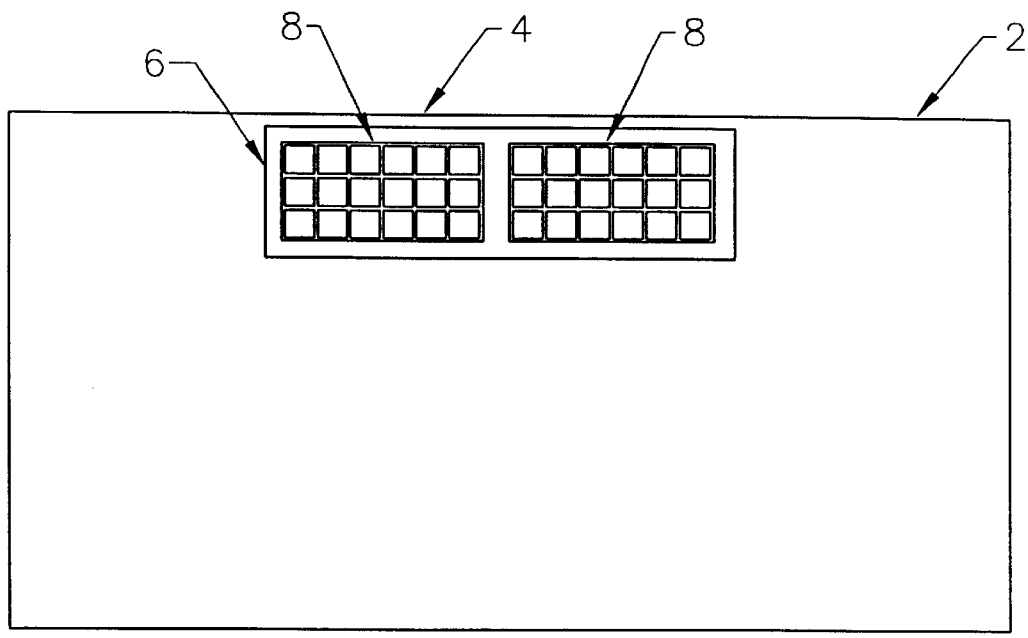
FIG. 1 is diagrammatic top plan view showing a prior art automated assembly system.
Figure 21:
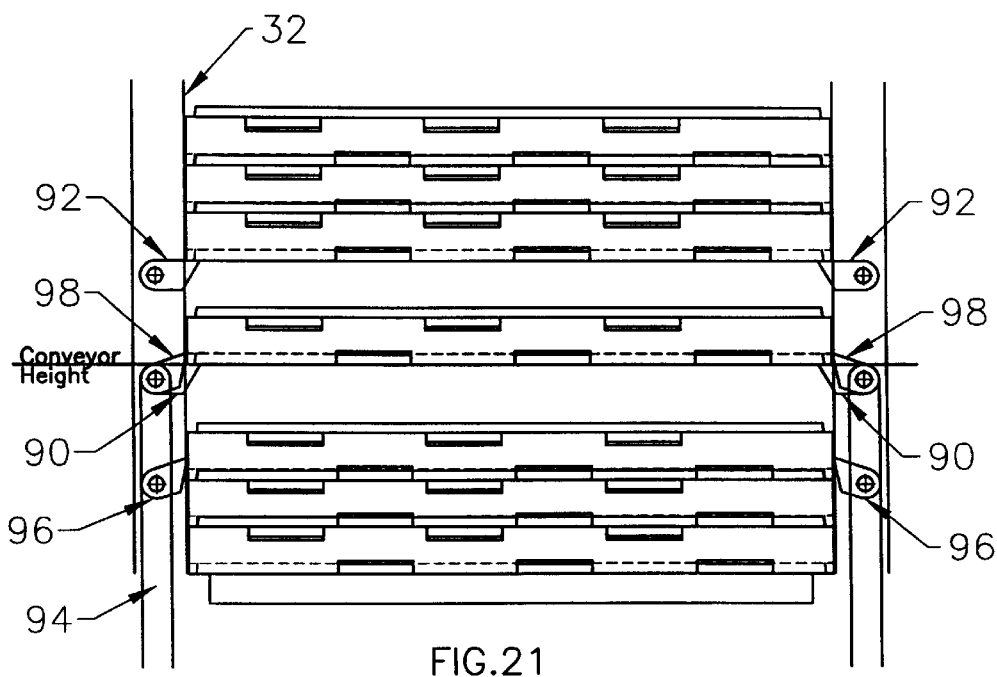
FIG. 21 is a partial diagrammatic cross-sectional view, similar to that of FIG. 7, of the second embodiment of the present invention.

Turning now to FIGS. 2, 3 and 3A, a brief description concerning two preferred prior art JEDEC carrier members will now be provided. As can be seen in these Figures, each carrier member 12 has a top surface 14 which is provided with a plurality of cavities 16 therein, e.g. between about 4 to 200 cavities, which are each able to accommodate a desired component 18 to be assembled by the automated assembly system. A portion of the top surface 14 of the carrier member 12 is partially recessed or removed to form a perimeter shoulder 15 extending around the perimeter of the carrier member 12. The narrower width top surface of the carrier member 12 forms a protrusion 20. The bottom surface of the carrier member 12 is provided with a recessed area 22 which is sized and shaped to matingly accommodate the protrusion 20 of another mating carrier member 12 to facilitate nesting or stacking of the plurality of separate carrier members 12, one on top of and closely adjacent the other. Such a stacking feature allows a plurality of carrier members 12 to be located, one on top of the other, and prevent the components 18, carried by each carrier member 12, from being inadvertently lost or separated from the associated cavity 16 supporting the component 18.

Each one of the carrier members 12 is provided with four conventional transfer notches 49 (see FIGS. 3 and 3A), one spaced apart pair being provided along each longitudinal side of the carrier member, to facilitate conveyance and/or handling of the carrier member 12. In addition, an alignment component 51 can be provided on each carrier member to facilitate feeding of the carrier members in a consistent and desired orientation. As such conveyance and alignment features are conventional and well known in the art, a further detailed description concerning the same is not provided.

The typical dimensions of the carrier member 12, shown in FIGS. 2 and 3, has a length dimension of about 12.70 inches and width dimension of about 5.35 inches and a height dimension of about 0.30 inches. The typical dimensions for a second embodiment of the carrier member 12, shown in FIGS. 2 and 3A, has a length dimension of about 12.70 inches and width dimension of about 5.35 inches and a height dimension of about 0.48 inches. Both of these embodiments of the carrier members 12 are made in accordance with the JEDEX #95-1 Standard. It is to be appreciated that the recessed area 22 and the protrusion 20 of the carrier member 12 can be reversed if desired, i.e. the top surface 14 of the carrier member 12 is provided with the recessed area 22 which supports the cavities 16 while the bottom surface of the carrier member 12 is provided with the mating protrusion 20.

Turning now to FIGS. 4 and 5, a brief discussion concerning the basis components of a first embodiment of the conveying apparatus 30, according to the present invention, will now be provided. As can be seen in those Figures, the automated conveying apparatus 30 comprises a top first (supply) bin 32 for holding a desired quantity of stacked carrier members 12, e.g. trays manufactured in accordance with the JEDEC Standards. The bottom portion of the first bin has an outlet 35 which communicates with an inlet of a feed mechanism 34 to sequentially feed the carrier members 12, one at a time, onto a first section 36 of a conveyor mechanism 38. The conveyor mechanism 38, in turn, conveys each sequentially fed carrier member 12 to an assembly area 40, at a remote end 42 of the conveyor mechanism 38, where each conveyed carrier member 12 is temporarily held in a restrained position. Thereafter, the automated assembly equipment 2 can retrieve the components 18, carried by the carrier member 12, to assemble a desired product(s) being manufactured. Once all of the components 18, carried by the carrier member 12, are properly placed during the manufacturing process, the conveyor mechanism 38 is again activated in a reverse direction to reconvey the emptied carrier member 12 back towards the feed mechanism 34 and discharge the empty carrier member 12 into a lower second (collection) bin 44. After the empty carrier member 12 is reconveyed back to the feed mechanism 34 and stored within the second bin 44, another full carrier member 12, containing a fresh supply of components 18 to be assembled, is then conveyed by the feed mechanism 34 to the assembly area 40. As each feed cycle typically only takes a few seconds or so, e.g. 2–4 seconds, the feed cycle does not significantly interfere with the substantially continuous production of desired products by the automated assembly system.

Turning now to FIGS. 4A and 5A, a brief discussion concerning the basis components of the second embodiment of the conveying apparatus 30, according to the present invention, will now be provided. As can be seen in those Figures, the automated conveying apparatus 30 comprises a bottom first (supply) bin 44 for holding a desired quantity of stacked carrier members 12, e.g. trays manufactured in accordance with the JEDEC Standards. The top portion of the first bin 44 has an outlet which communicates with an inlet of a feed mechanism 34 to sequentially feed the carrier members 12, one at a time, onto a first section 36 of a conveyor mechanism 38. The conveyor mechanism 38, in turn, conveys each sequentially fed carrier member 12 to an assembly area 40, at a remote end 42 of the conveyor mechanism 38, where each conveyed carrier member 12 is temporarily held in a restrained position. Thereafter, the automated assembly equipment can load an empty carrier member 12 with the necessary components 18 for later assembly of a desired product(s). Once all of the components 18 are properly loaded onto the carrier member 12, the conveyor mechanism 38 is again activated in a reverse direction to reconvey the loaded carrier member 12 back towards the feed mechanism 34 and discharge the loaded carrier member 12 into a top second (collection) bin 32. After the filled carrier member 12 is reconveyed back to the feed mechanism 34 and stored within the second bin 32, another empty carrier member 12 is then conveyed by the feed mechanism 34 to the assembly area 40. As each feed cycle typically only takes a few seconds or so, e.g. 2–4 seconds, the feed cycle does not significantly interfere with the substantially continuous production of desired products by the automated assembly system.

The first bin 32 or 44 may be provided with either a fixed or removable key or some other first alignment component (not shown) which is attached or located within the first bin 32 or 44. The first alignment component, if utilized, cooperates with the mating second alignment component 51 (see FIG. 2) formed or located on each of the carrier members 12 to facilitate correct orientation of the carrier members 12 as they are loaded or placed in the first bin 32 or 44. This alignment feature ensures that when the carrier members 12 are fed and conveyed to the assembly area 40 of the conveyor mechanism 38, the conveyed components 18 are properly oriented, with respect to the conveyor mechanism 38, for accurate pick up and assembly by the automated assembly equipment 2 or filling the empty carrier members 12 with a supply of components 18 for later manufacture.

In both embodiments, the feed mechanism 34 comprises a conventional drive device such as a pneumatic cylinder 46 (see FIG. 6) which supports a pusher rod or element 48. The pusher element 48 has an end face which forms a pushing surface 50 to facilitate movement and loading of the proximate carrier member 12, from either a transfer assembly 54 or a set of first fixed pivots 90, onto the first section 36 of the conveyor mechanism 38 for conveyance to the assembly area 40 and a further detailed description concerning the same will follow below.

According to a preferred form of the present invention, the conveyor belts 39 of the conveyor mechanism 38 are simultaneously rotated by a conveyor motor CM until a switch S1 is activated and the conveyor mechanism 38 is stopped. Typically, the time period is about 3 to 4 seconds which is a sufficient amount of time to facilitate loading of a carrier member 12 onto the first section 36 of the conveyor mechanism 38 and ensure complete conveyance of the carrier member 12 against the stop member 74. If desired, the conveyor mechanism 38 can operate for a slightly longer time period, e.g. a quarter of a second or so, to ensure that the leading end 72 (see FIG. 3A) of the carrier member 12 is in an abutting relationship with the stop member 74. The carrier member 12 remains in this position until the conveyor mechanism 38 is again reactivated. Due to a clamping and sandwiching arrangement discussed below, the conveyed carrier member 12 is firmly supported, in the assembly area 40, to prevent inadvertent pick up of the carrier member 12 itself by retrieval equipment of the automated assembly system 2, i.e. only the components 18 are able to be retrieved from or placed onto the carrier member 12. The carrier member 12 is maintained in this position until all of the components 18, carried by the carrier member 12, are either properly retrieved or placed by the automated assembly system 2. Once this has occurred, the emptied or filled carrier member 12 is reconveyed along the conveying surface of the conveyor mechanism 38 toward the feed mechanism 34.

During the return travel, the carrier member 12 is guided by an upper pair of opposed guide rails 68 (FIG. 18) which facilitates sandwiching the carrier member 12 between inwardly facing surfaces of the guide rails 68 and the upwardly facing surfaces of the conveyor belts 39. If desired, the inwardly facing surfaces of the guide rails 68 can be provided with an anti-friction coating, e.g. polytetrafluoroethylene, to facilitate conveying of the carrier members 12 therealong. The carrier member 12 is conveyed along the guide rails 68 until it reaches a location adjacent the feed mechanism 34. At the end, the conveyor mechanism 38 discharges the emptied carrier member 12, via an exit, onto the first set of fixed pivots 90, as described above.

Now that the basic components have been described, a further detailed description concerning the first embodiment of feeding filled carrier members from the first bin 32 to the assembly area 40 and from the assembly area 40 to the second bin 44 will be initially provided, with reference to FIGS. 4–17, and this will be followed by a detailed description concerning the second embodiment of feeding empty carrier members 12 from the first bin 44 to the assembly area 40 and from the assembly area 40 to the second bin 32 provided, with reference to FIGS. 4A, 5A and 20–33.

Figure 7:
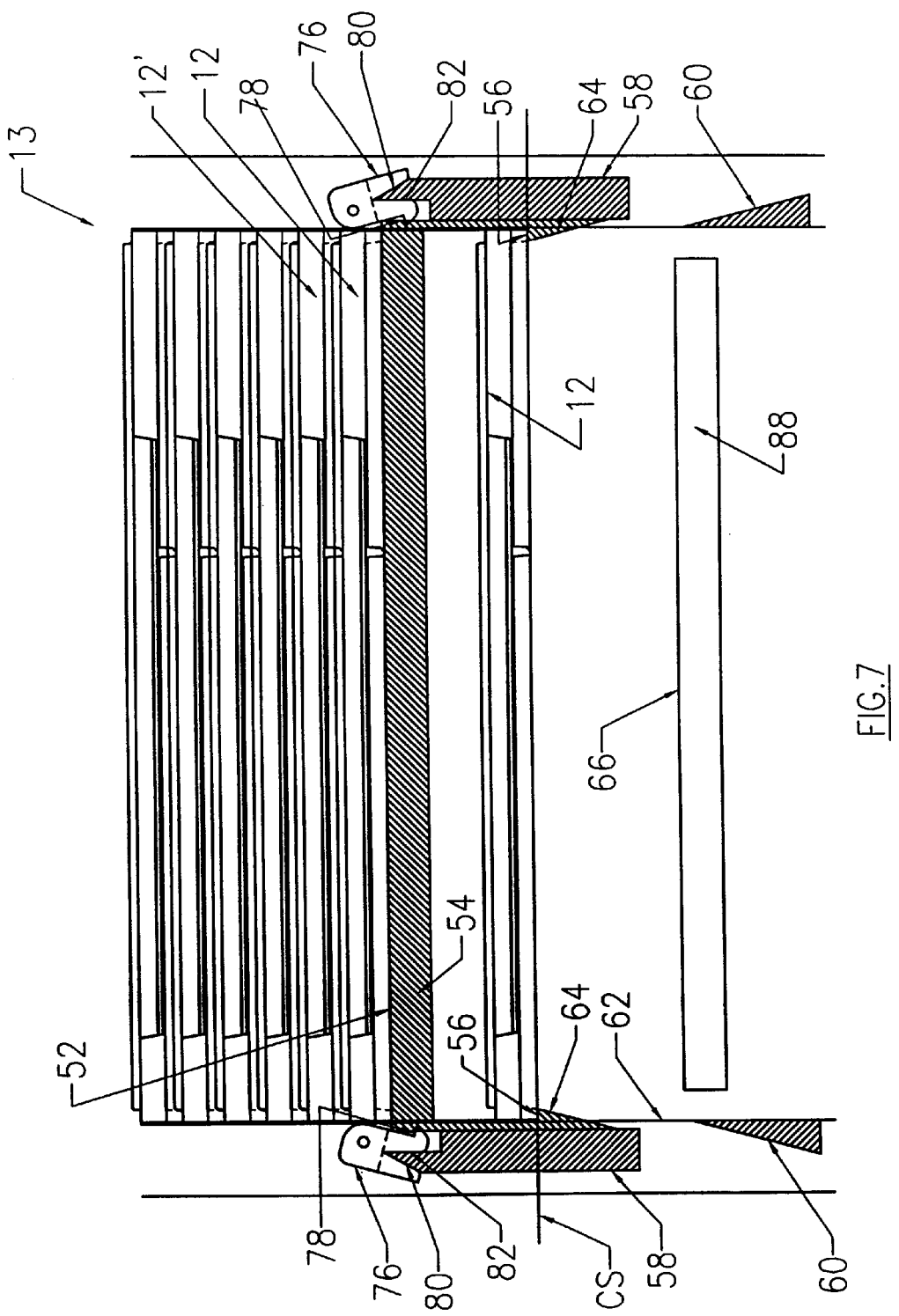
FIG. 7 is a partial diagrammatic cross-sectional view generally along section line 7—7 of FIG. 5.
Figure 8:
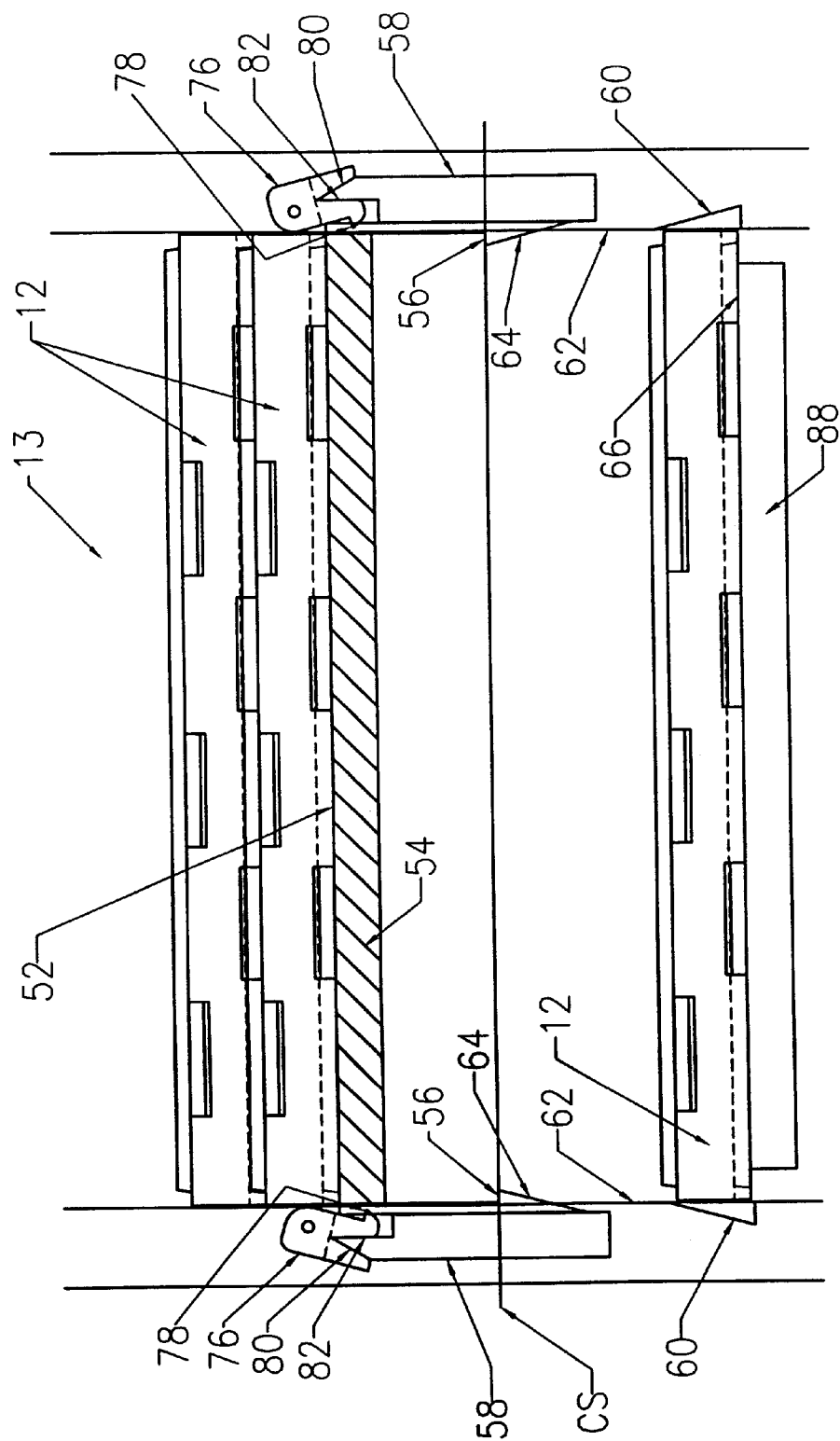

With reference now to FIGS. 4–17, the first embodiment of the feed mechanism 34 of the present invention is now described. As can be seen in FIGS. 5 and 8, the transfer assembly 54 is shown in its idle stand-by position ready to receive a carrier component 12, depleted of all of its components 18, from the assembly area 40. For the sake of simplicity, the following description will describe a mid-cycle of the present invention with one carrier member 12 already being located at the assembly area 40.

When the automated assembly system 2 requires further components 18 to be assembled, the feed mechanism 34 is activated. As seen in FIGS. 7 and 8, the transfer assembly 54 is located such that the lower carrying surface 56 of the transfer assembly 54 is horizontally aligned with the conveying surface CS of the conveyor mechanism 38. Accordingly, as an emptied carrier member 12 is conveyed from the assembly area 40 toward the transfer assembly 54, the empted carrier member 12 will be conveyed into and received by the lower carrying surface 56 of the transfer assembly 54. Once the empted carrier member 12 is completely received and accommodated solely by the lower carrying surface 56 (see FIG. 9) and a leading end of the carrier member 12 contacts a first stop sensor S1, the first stop sensor S1 is activated and sends a signal to the computer C to stop drive of the conveyor motor CM. The transfer assembly 54 is then moved vertically downwardly toward the second bin 44, so that the carrier member 12, retained by the lower carrying surface 56 of the transfer assembly 54 (see FIG. 7), can be deposited in the second bin 44. As the transfer assembly 54 approaches either an upwardly facing base surface 66 of the elevator assembly 88 of the second bin 44 or a top surface of the topmost collected carrier member 12, the transfer assembly 54 then gently lowers the retrieved carrier member 12 (see FIGS. 10–14) thereon. This gentle lowering is achieved via a lower portion of two opposed pairs projecting notches 64, of the transfer assembly 54, being brought into engagement with a respective one of four mating fixed pry surfaces 60, supported by opposed side wall surfaces 62 of the second bin 44, which bias the respective projecting notches 64 outwardly away from one another to allow a gentle separation and release of the retrieved carrier member 12, from the two opposed pair projecting notches 64. The notches 64 are supported by a lower surface of the transfer assembly 54 and forming the lower carrying surface 56 of the transfer assembly 54, and facilitate release of the retrieved carrier member 12 onto either the base surface 66 of the elevator assembly 88 or the top surface of the topmost carrier member 12.

It is to be appreciated that the transfer assembly 52 and the cam flippers 58 are separate components but work in unison with one another to facilitate both loading and unloading of a carrier member 12, e.g. there is limited relative sliding movement between those two components. Both components are driven in a conventional manner by the same transfer drive (e.g. an air cylinder AC) to one of two end positions and the transfer drive is controlled by the computer C.

Once the transfer assembly 54 releases the retrieved carrier member 12, the base surface 66 of the elevator assembly 88 is automatically indexed down or lowered, by the computer C actuating elevator motor EM, a distance equal to one tray thickness of the carrier members 12 (see FIG. 15) to facilitate stacking the next retrieved carrier member 12 from the assembly area 40. The indexing or lowering of the elevator assembly 88 is achieved by the elevator motor EM which is coupled to the computer C to facilitate raising and lowering movement of the elevator assembly 88. As such teaching is conventional and well known in the art, a further detailed description concerning the same is not provided.

Following this indexing, the transfer assembly 54 is then moved upwardly and returned back to its initial upper position by air cylinder AC (see FIGS. 16, 17 and 8) to facilitate retrieving another carrier member 12 from the assembly area 40. During this return action, the projecting notches 64 return back to their normal inward position and the upper carrying surface 52 of the transfer assembly 54 is simultaneously at least partially loaded with a lowermost carrier member 12 of the nested array 13 and a further detailed description concerning such loading will follow below.

Figure 6:
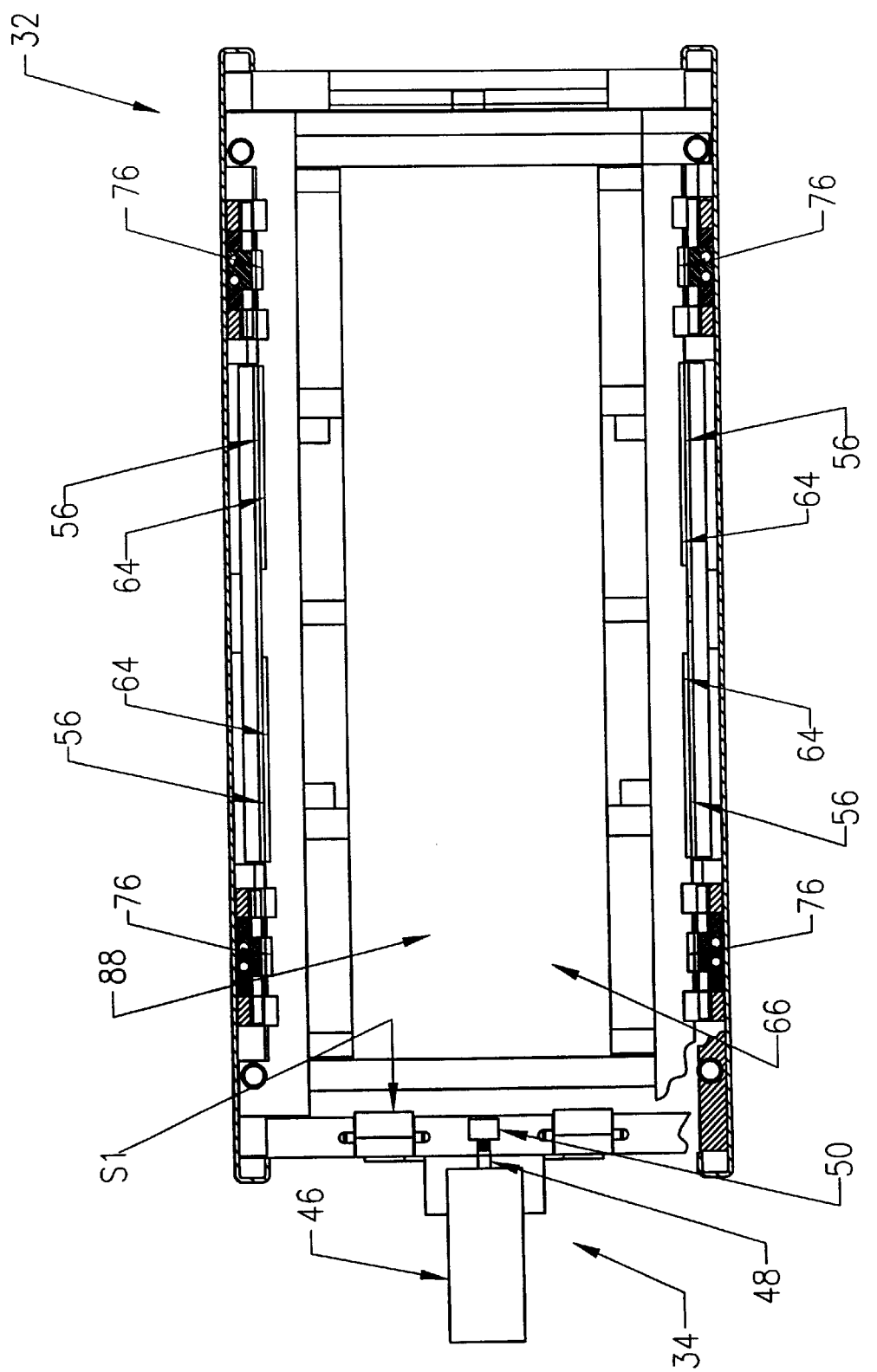
FIG. 6 is a partial diagrammatic cross-sectional view through the conveying apparatus of FIG. 4 generally along section line 6—6.

As can be seen in FIG. 15, for example, the lowermost carrier member 12 is supported by two opposed pair of pivot members 76 (only the front two pivot members can be seen while the remaining other two pivot members are located behind and not visible in this Figure, the four pivot members can be seen in FIG. 6). Each pivot member 76 is fixedly located and supported by a side wall surface of the first bin 32 and is spring biased by a spring (not shown in detail) to pivot inwardly toward the other opposed pivot member 76 so that a lower free hooked end 78 (see FIG. 8) of each pivot member 76 can engage with one of the transfer notches 49 (see FIGS. 3 and 3A) of the carrier member 12 to facilitate support of the lowermost carrier member 12 as well as the remainder of the nested array 13 within the first bin 32.

During the end of the return stroke of the transfer assembly 54, as shown in FIG. 17, the lowermost carrier member 12 is brought into abutment with the upper carrying surface 52 of the transfer assembly 54.

To facilitate release of the lowermost carrier members 12 from a remainder of the nested array 13, the two opposed pairs of the sliding cam flippers 58, which each have a tapered leading edge 80 that is aligned to engage with a mating cutout notch 82 provided in a downwardly facing portion of one of the four pivot members 76, cause the lower free hooked end 78 of each pivot member 76 to be biased away from one another out of engagement with the transfer notches 49 of the lowermost carrier member 12 of the nested array 13 and retract into the side wall of the first bin 32. As a result of such retraction, the carrying surface 52 of the transfer assembly 54 solely supports the lowermost carrier member 12 as well as the remainder of the nested array 13.

As noted above, the two opposed pairs of the sliding cam flippers 58 operate in combination with the transfer assembly 54 and move substantially in unison with the transfer assembly 54 but have approximately ¼ of an inch or so of movement or play. Specifically, the sliding cam flippers 58 are spring biased in a vertical upward position relative to the transfer assembly 54 (see the spring biased position of FIG. 10) to maintain a prolonged engagement with the respective cut out notches 82, even when the transfer assembly 54 commences to move vertically downward and thereby facilitate a gradual release from the respective pivot member 76.

The transfer assembly 54 has a stroke of about 0.875 inch between the upper position, shown in FIG. 9, and the lower end position, shown in FIG. 15. Movement of the transfer assembly 54, its upper and lower positions, is achieved by the air cylinder AC which is operated in a conventional manner and coupled to the transfer assembly via four rods (not numbered). As such, a further detailed description concerning the same is not provided.

As the transfer assembly 54 commences moving vertically downward toward the second bin 44, the tapered leading edges 80 of the sliding cam flippers 58 initially remain engaged with the mating cutout notches 82 (see FIG. 10), due to their spring bias, and then subsequently become disengaged from the mating cutout notches 82 provided in a downwardly facing surface of the pivot members 76 (see FIG. 11) once the transfer assembly 54 has been lowered at least about ¼ of an inch or so. Such disengagement from the mating cutout notches 82, allows the spring biased pivot members 76 to re-pivot back inwardly toward the interior of the first bin 32 to their normal biased positions and engage with the next lowermost carrier members 12' as the nested array 13 is lowered by the transfer assembly 54 (see FIG. 12).

It is to be appreciated that the disengagement of the sliding cam flippers 58, from the mating cutout notches 82 of the pivot members 76, is such that transfer assembly 54 must have been lowered a sufficient distance, e.g. at least ⅛ of an inch, so that the free hooked end 78 of the pivot members 76 cannot re-engage with the transfer notches 49 of the lowermost carrier member 12, e.g. the free hooked end 78 can only engage with the transfer notches 49 of the next lowermost carrier member 12' of the nested array 13. In a preferred form of the invention, the disengagement of the sliding cam flippers 58 from the mating cutout notches 82 of the pivot members 76 will be just slightly after the transfer assembly 54 has lowered the lowermost carrier member 12 a sufficient distance to prevent the free hooked end 78 from re-engaging with the transfer notches 49 of the lowermost carrier members 12. As such, the free hooked ends 78 will slide along the exterior side wall surface of the lowermost carrier member 12 (see FIG. 10) prior to engaging with the next lowermost carrier member 12' of the nested array 13, as can been seen in FIG. 11.

As the transfer assembly 54 continues to move vertically downwardly toward the second bin 44, the lowermost carrier member 12 remains supported by the upper carrying surface 52 of the transfer assembly 54 while the next lowermost carrier member 12', supporting the remainder of the nested array 13, becomes engaged with and supported by the two opposed pairs of pivot members 76. Once this occurs, the lowermost carrier member 12 separates from the next lowermost carrier member 12' of the nested array 13 (see FIG. 13). The transfer assembly 54 continues moving vertically downward toward the second bin 44 until the upper carrying surface 52 of the transfer assembly 54 is horizontally aligned with the conveying surface of the conveyor mechanism 38. Such aligned arrangement is shown in FIG. 14 of the drawings.

With the transfer assembly 54 horizontally aligned with the conveyor mechanism 38, the left side of the pneumatic cylinder 46 (as seen in FIG. 5) is supplied with fluid pressure such as air. As this occurs, the pneumatic cylinder 46 moves the pusher element 48 in the direction of arrow A toward the lowered carrier member 12, supported by the upper carrying surface 52 of the transfer assembly 54, to commence horizontal displacement of the lowered carrier member 12 onto the first section 36 of the conveyor mechanism 38. As the pusher element 48 nears the completion of its loading stroke, e.g. about 2 inches or so, the conveyor mechanism 38 will solely convey the carrier member 12 and facilitate release of the carrier member 12 from the pusher element 48.

Once the pusher element 48 is separated from the carrier member 12, a pair of spaced apart endless conveyor belts 39, of the conveyor mechanism 38, convey the carrier member 12 toward the assembly area 40 of the conveyor mechanism 38. The conveyor motor CM is coupled, by a conventional pulley arrangement, to at least one of a first and a second pair of return rollers 69 or 70 supporting the pair of spaced apart conveyor belts 39. Both the first pair of return rollers 69 and the second pair of return rollers 70 are connected to one another by a shaft to provide simultaneous rotation thereof by the conveyor motor CM. It is to be appreciated, however, that other conventional and well known drive mechanisms can also be provided for providing drive from the conveyor motor CM to the conveyor belts 39.

If desired, a pusher element sensor (not shown) may be activated at the end stroke of the pneumatic cylinder 46 to reverse the pneumatic cylinder 46 and return the pneumatic cylinder 46 in the opposite direction indicated by arrow B. To return the pusher element 48, fluid pressure (e.g. air) is now supplied to the right side of the pneumatic cylinder 46. The pusher element sensor can be, for example, a leading end of the pneumatic cylinder 46 provided with a magnetic portion that activates the switch when the pneumatic cylinder 46 is moved to its maximum extended position so that the return stroke of the pneumatic cylinder 46 is thus activated.

Once the return stroke of the pusher element 48 is completed, the transfer assembly 54 is then again raised (see FIGS. 16 and 17) so as to come into engagement with the next lowermost carrier member 12 of the stacked array 13 (see FIG. 8). Such engagement releases the new lowermost carrier member 12 such that the new lowermost carrier member 12 as well as a remainder of the nested array 13 are solely supported on the upper carrying surface 52 of the transfer assembly 54, as described above.

Once all of the desired components 18 are removed from the carrier member 12 located adjacent the assembly area 40, the computer C determines that a fresh supply of components 18 is required. Due to that computer determination, or alternatively a manual determination, the computer C activates the conveyor motor CM to operate in a reverse drive direction which causes the first and second return rollers 69, 70 to rotate in an opposite direction to reconvey the emptied carrier member 12 back toward the first section 36 of the conveyor mechanism 38. The final conveyance of the carrier member 12, by the conveyor mechanism 38, causes the carrier member 12 to be supported solely by the lower carrying surface 56 of the transfer assembly 54. Once the carrier member 12 is completely accommodated by the lower support surface of the transfer assembly 54, the conveyor mechanism 38 then stops rotation. Thereafter, the transfer assembly 54 moves downwardly, in the direction of the second bin 44, to deposit the emptied carrier member 12 on top of the topmost carrier member 12 accommodated within the second bin 44. This lowering motion also simultaneously lowers the next lowermost carrier member 12', containing a fresh supply of components 18 to be assembled, to the level of the conveyor mechanism 38 for conveyance by the feed mechanism 34 to the assembly area 40.

The lowering motion of the transfer assembly 54, of the emptied carrier member 12, also facilitates the depositing and release of the emptied carrier member 12 within the second bin 44. It is to be appreciated that the transfer assembly 54 must remain, in this lowered position, a sufficient amount of time to facilitate loading of the carrier member 12 from the upper carrying surface 52 onto the conveyor mechanism 38 via the feed mechanism 34. Once this has occurred, the transfer assembly 54 can be raised to its upper position (see FIG. 8) to facilitate loading of the new lowermost carrier member, of the stacked array 13, onto the upper carrying surface 52 of the transfer assembly 54 for a further cycle while the lower carrying surface 56, of the transfer assembly 54, is brought to the same level as that of the conveying surface CS of the conveyor mechanism 38, to facilitate receiving a new carrier member 12 once it is emptied of its components 18.

Figure 18:
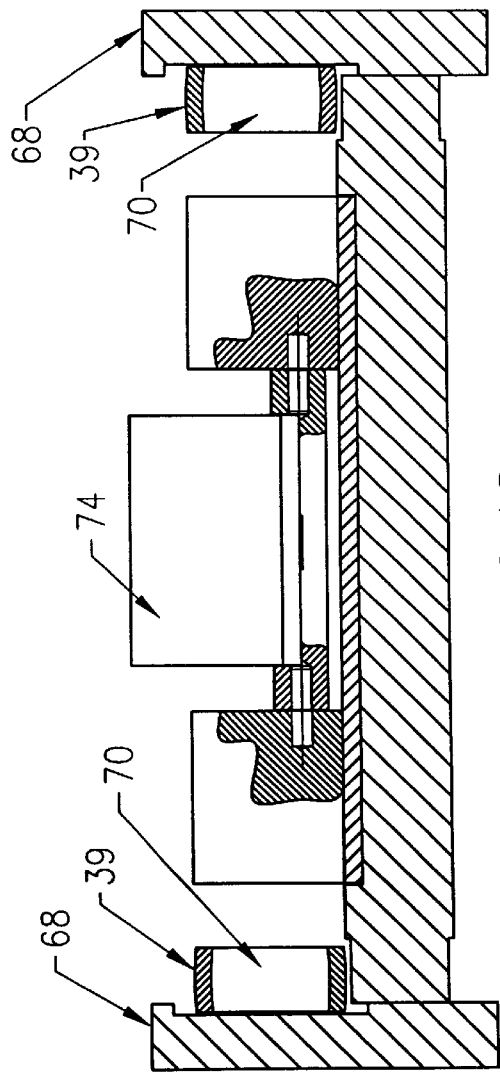
FIG. 18 is a diagrammatic cross-sectional view of the conveyor mechanism generally along section line 18—18 of FIG. 5.
Figure 19:
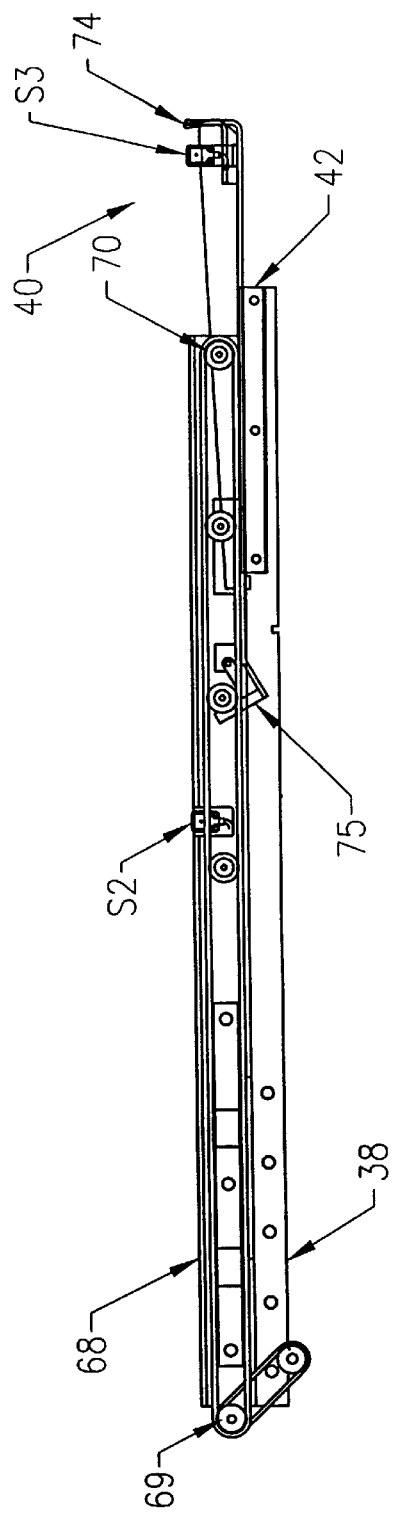
FIG. 19 is a diagrammatic cross-sectional view of the conveyor mechanism generally along section line 19—19 of FIG. 5.
Figure 20:
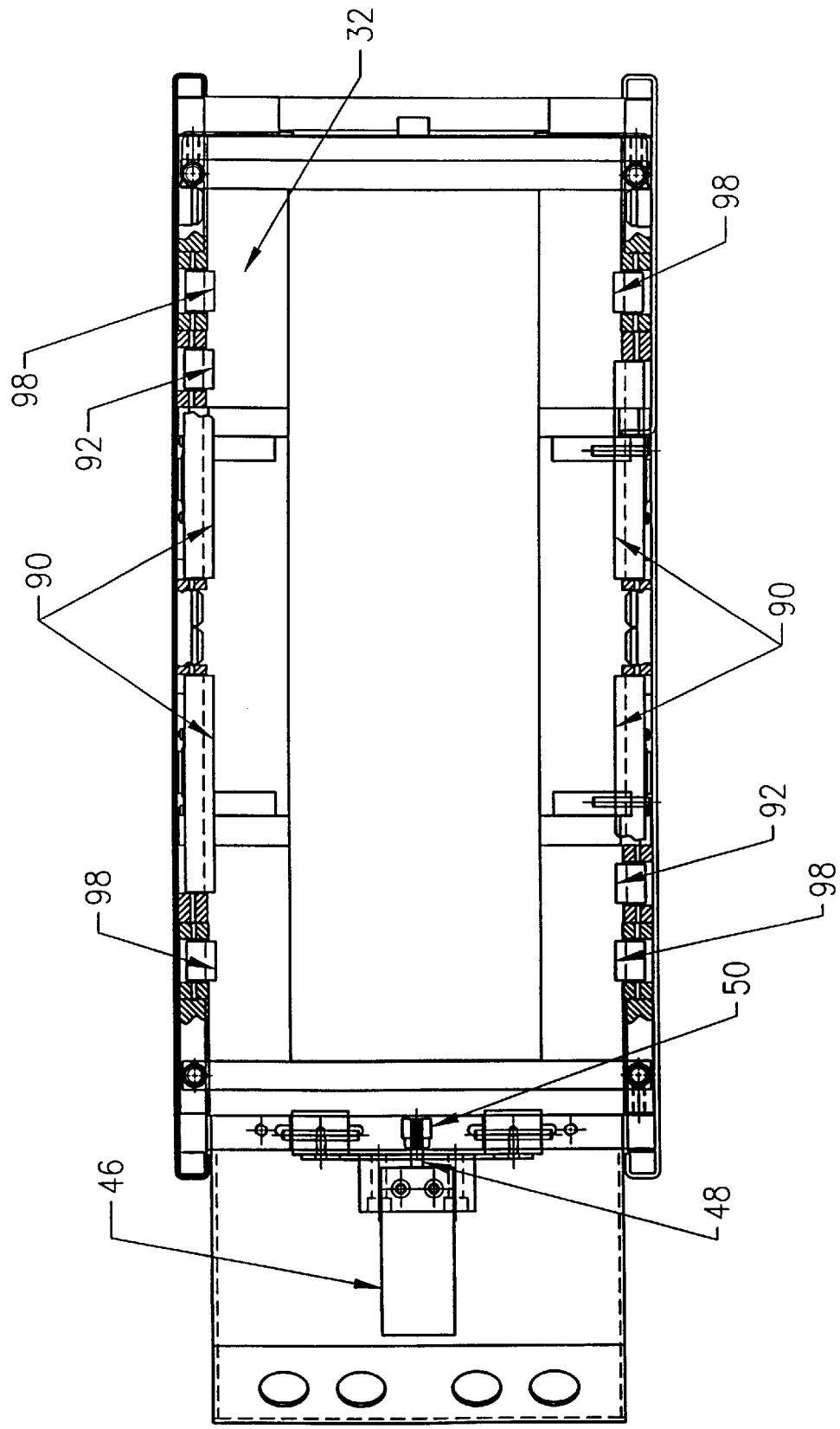
FIG. 20 is a partial diagrammatic cross-sectional view through the conveying apparatus of a second embodiment of the present invention of FIG. 4A generally along section line 20—20.

Turning now to FIGS. 18 and 19, a detailed description concerning the operation and function of the conveyor mechanism 38 and the assembly area 40 will now be provided. As can be seen in FIG. 18, the conveyor mechanism 38 is provided with a pair of opposed guide rails 68 which facilitate containing of the conveyed carrier member between the inwardly facing surfaces of the guide rails 68 and on the top surfaces of the conveyor belts 39.

The guide rails 68 facilitate conveying of the carrier member 12 to the second return rollers 70 of the conveyor mechanism 38, until a leading end 72 of the carrier member 12 abuts against a stop member 74. Once the carrier member 12 abuts against the stop member 74, a stop member sensor S3 (not shown in detail) associated with the stop member 74 is activated and the computer C receives a signal which stops the conveyor motor CM from rotating the conveyor belts 39. The conveyor mechanism 38 is generally provided with three sensors S1, S2 and S3. A beam sensor S2 is located midway along the conveyor mechanism 38 to output a signal to the computer C which causes the rotation of the conveyor motor CM to slow down since the carrier member 12 is approaching the assembly area 40.

As noted above, there is a sensor S3 associated with the stop member 74 which turns the conveyor motor CM off as soon as the stop member 74 is sufficiently engaged. Once this occurs, a clamping member, accommodated within the conveyor mechanism 38, pivots from a lowered retracted position into an upper active clamping position in which the clamping mechanism 75 forces the carrier member 12 toward the stop member 74 to clamp the conveyed carrier member at the assembly area 40 to prevent carrier member 12 from being inadvertently moved or disturbed from its conveyed position at the assembly area 40. The clamping mechanism is operated by a pneumatic cylinder (not numbered) and controlled by the computer C. Lastly, a first sensor S1 is located adjacent the feed mechanism 34 for stopping the conveyor motor CM once the conveyor mechanism 38 has reconveyed the returned carrier member 12 so that it completely accommodated by the transfer assembly 54.

To facilitate maintaining the elevator assembly 94 at a desired height, the first bin 44 or the second bin 44 is provided with high and low beam sensors H1, L1 which are spaced apart from one another by a small distance, e.g. about $40/1000$ inch or so. The high and low beam sensors H1, L1 provide an operating range at which the base surface 66 of the elevator assembly 88 or top surface of the topmost carrier member 12, contained in the first bin 44 or the second bin 44, is to be conveyed. The high and low beam sensors H1, L1 are both coupled to the computer C (not shown in detail) to control operation of the elevator motor EM to convey the elevator assembly 88 to the desired operating height, e.g. an elevator assembly height such that a leading edge of an uppermost carrier member 12 or the base surface 66 of the elevator assembly 88 interrupts only the beam of the low beam sensor L1 but does not block the beam of the high beam sensor H1.

The elevator assembly 88 is supported by two opposed pairs of endless chains 95 which rotate about fixed pulleys. The elevator assembly 88 is coupled to only one and the same side of each of the four endless chains 95 so that as the four endless chains 95 rotate, in either one direction or another, the elevator assembly 88 is correspondingly raised or lowered. A chain drive 97, from the elevator motor EM, is coupled in a conventional manner to simultaneously drive all four endless chains 95. As such drive arrangement is conventional and well known, a further detailed description concerning the same is not provided.

According to the first embodiment, the first bin 32 is provided with an empty sensor SE (not shown in detail), located adjacent the feed mechanism 34, to signal the computer C that the first bin 32 is empty and a fresh supply of full carrier members is required while the second bin 44 is provided with a full sensor SF (not shown in detail), located remote from the feed mechanism 34, to indicate that the second bin 44 is full of carrier members and needs to be emptied. In the second embodiment, the first bin 44 is provided with an empty sensor located adjacent the feed mechanism 34 (e.g. a sensor that detects the presence of the metal elevator assembly) to determine the location of the elevator and signal to the computer C that the first bin 44 is empty and a fresh supply of empty carrier members is required while the second bin 32 is provided with a full sensor SF, located remote from the feed mechanism 34, to indicate that the second bin 32 is full of carrier members and needs to be emptied.

The elevator assembly 88 maintains the desired spacings between the conveying surface of the guide rails 68 of the conveyor mechanism 38 and either a base surface 66 of the second bin 44 or a top surface of the topmost carrier member 12 contained within the second bin 44. Due to this constant spacing arrangement, it is ensured that as each carrier member 12 is collected within the second bin 44, the second bin 44 is gradually indexed or moved downwardly away from the exit of the conveyor mechanism 38 to facilitate maintaining the desired spaces and ensure proper stacking of the carrier members 12. Due to as it is discharged by the conveyor belt 39 of the transfer mechanism 54 is properly and gently deposited into the second bin 44 to facilitate collection of the carrier members 12 in a stacked array with one another for reuse.

With reference to FIGS. 4A, 5A and 20–33, a second embodiment of the present invention will now be described. Opposed inwardly facing longitudinal side walls of the second bin 32 supports a vertically lower first set of two opposed pairs of elongate, fixed pivots 90 (a total of four (4) lower fixed pivots) which are located with their top surfaces horizontally aligned with the conveying surface CS of the conveyor mechanism 38. The first set of fixed pivots 90 are maintained in their normal horizontal extending orientation by a stop (not shown) and can only rotate vertically upward in one direction. Each of these first set of fixed pivots 90 protrudes inwardly toward one another a sufficient distance to facilitate support of a bottom edge surface of a carrier member 12 thereon at a level which is horizontally aligned with the conveyor mechanism 38 to facilitate both feeding, by the pushing surface 50, of a carrier member 12 onto the conveyor mechanism 38 and receiving of a carrier member 12 from the conveyor mechanism 38. In addition, the opposed inwardly facing longitudinal side walls of the second bin 32 supports a vertically upper second set of two opposed pairs of fixed pivots 92 (a total of four (4) upper fixed pivots) vertically above the first set of fixed pivots 90. The second set of fixed pivots 92 are also maintained in their normal horizontal extending orientation by a stop (not shown) and can only rotate vertically upward in one direction. The first and second sets of fixed pivots 90, 92 are vertically spaced apart from one another (i.e. above one another) a sufficient distance to allow conveyance of a carrier member 12 from the first set of fixed pivots 90 to the second set of fixed pivots 92, e.g. they are vertically spaced apart from one another a distance of about 0.875 inch or so.

The transfer assembly 54, according to this second embodiment, includes a vertically lower first set of two opposed pairs of movable pivots 96 (a total of four (4) lower movable pivots). This first set of movable pivots 96 protrudes inwardly toward one another a sufficient distance to facilitate support of a carrier member 12 thereon. The first set of movable pivots 96 are also maintained in their normal horizontal extending orientation by a stop (not shown) and can only rotate vertically upward in one direction. In addition, the transfer assembly 54, according to this second embodiment, also supports a vertically upper second set of two opposed pairs of movable pivots 98 (a total of four (4) upper movable pivots). The second set of movable pivots 98 are also maintained in their normal horizontal extending orientation by a stop (not shown) and can only rotate vertically upward in one direction. Both the first and second set of movable pivots 96, 98 of the transfer assembly 54 are spaced apart from one another an identical distance to the spacing of the first and second sets of fixed pivots 90, 92 in the second bin 32 to facilitate feeding of a carrier member 12. The first and second set of fixed pivots 90, 92 are sandwiched between the first set and the second set of movable pivots 96, 98, as can be seen in FIGS. 4A and 5A. In addition, the first set of fixed pivots 90 are elongate members to facilitate level conveying of the carrier member 12 to the conveyor mechanism 38 and receiving the carrier member 12 from the conveyor mechanism 38.

When an empty carrier member 12 is required at the assembly area 40, the feed mechanism is activated. As can be seen in FIG. 22, the inwardly facing leading edge of the first movable pivots 96 are aligned to engage with the transfer notches 49 of the topmost carrier member 12 in the first bin 44. As the transfer assembly 54 moves vertically upward, such motion facilitates separation of the topmost carrier member 12, contained within the first bin 44 from the next topmost carrier member 12' (see FIGS. 23 and 24). The transfer assembly 54 continues to vertically raise the topmost carrier member 12 and eventually such vertical motion causes the lowermost fixed pivots 90 to rotate into a retracted position, within the side walls of second bin 32, and allow the topmost carrier member 12 to pass thereby (see FIGS. 24 and 25). After the topmost carrier member 12 is conveyed past the first set of fixed pivots 90, all four fixed pivots 90 re-pivot back to their extended gravity biased protruding normal horizontal positions in which they are located to support the elevated topmost carrier member 12 (see FIG. 26). The transfer assembly 54 then commences its return downward stroke back toward the first bin 44 and such return movement causes the lower movable pivots 96 of the transfer assembly 54 to eventually become disengaged from the elevated topmost carrier member 12 (see FIG. 27) and the elevated topmost carrier member 12 is then supported solely by the first set of fixed pivots 90. Such return motion of the transfer assembly 54 also causes the second set of movable pivots 98 of the transfer assembly 54 to become retracted within the side wall as they pass by the elevated carrier member 12 until the transfer assembly 54 is returned back to its initial retracted position (see FIG. 28). Once the transfer assembly 54 is returned to this position, the pusher element 48 can facilitate loading of the elevated empty carrier member 12 from the first set of fixed pivots 90 onto the first section 36 of the conveyor mechanism for conveyance to the assembly area 40, as described above.

After the emptied carrier member 12 is filled with desired components, at the assembly area 40, the conveyor mechanism 38 is then reversed to reconvey the filled carrier member 12 back toward the first section 36 of the conveyor mechanism 38 and onto the first set of fixed pivots 90. As the filled carrier member 12 enters the first set of fixed pivots 90, the filled carrier member 12 is supported by the first set of fixed pivots 90, as can be seen in FIG. 29. Once this has occurred, the transfer assembly 54 is ready to convey another topmost emptied carrier member 12, from the first bin 44, for conveyance to the feed mechanism 34. As this motion occurs, the first set of movable pivots 96 of the transfer assembly 54, conveys a new topmost empty carrier member 12 vertically upward (see FIG. 30) toward the first set of fixed pivots 90, in the same manner previously described.

Simultaneously while this motion is occurring, the second set of movable pivots 98 of the transfer assembly 54 engage with the filled carrier member 12, returned from the assembly area 40, via engagement with the respective transfer notches 49. Due to such engagement, the second set of movable pivots 98 of the transfer assembly 54 raise the returned and filled carrier member 12 vertically upward, as can be seen in FIGS. 30 and 31, into the inlet of the second bin 32. The transfer assembly 54 continues to raise the filled carrier member 12 to a level above that of the second set of fixed pivots 92 (see FIG. 31).

Such motion of the transfer assembly 54 initially causes the second set of fixed pivots 92 to pivot and become retracted within the side wall of the second bin 32, as the filled carrier member 12 is conveyed there past, and the filled carrier member 12 is raise a sufficient distance which allows second set of fixed pivots 92 to re-pivot and return back to their initial spring biased horizontal positions, as can be seen in FIG. 31. Once this has occurred, the transfer assembly 54 returns back to its initial lowered position, as can be seen in FIGS. 32 and 33. During such return stroke, the filled and elevated carrier member 12 is gently lowered onto the second set of fixed pivots 92 and eventually become solely supported by the second set of fixed pivots 92 (see FIG. 33) as the transfer assembly 54 returns back towards its initial lowered end position for reconveying another topmost carrier member 12 from the first bin 44 as well as simultaneously elevating another filled and returned carrier member 12 received from the assembly area 40.

The first and second bins 32, 44 are designed to be loaded with a desired quantity of carrier members, e.g. about 40 thin JEDEC trays (see FIG. 3) or 20 thick JEDEC trays (see FIG. 3A). Once the second bin 44 has collected a desired amount of stacked carrier members 12, a door (not shown in detail) of the second bin 44 may be pivoted, via a pivot, to an open position to facilitate removal of the stacked carrier members 12 from the second bin 44. Following this, the door is repivoted back to its vertical in use position to facilitate further collection of additional carrier members 12 in the first bin 44 or the second bin 44.

It is to be appreciated that the pneumatic system 46, as well as all of the motors disclosed above can be coupled to and controlled by the computer C (FIG. 4). The computer C can, in turn, be coupled to the automatic assembly system 2 so that when the automatic assembly system 2 desires additional components to be assembled, the computer C activates the conveyor mechanism 38, of the present invention, to operate so that the emptied or filled carrier member 12 is conveyed from the assembly area 40 to the second bin 32, 44 and a further carrier member 12, containing a new supply of components 18 to be assembled or for filling with a supply of components 18 to be assembled, is conveyed to the assembly area 40.

The inventors also contemplate that a plurality of similar or identical conveying apparatuses 30, according to the present invention, can be arranged side by side next to one another to supply various components to the automated assembly system 2 while occupying a minimal amount of working area within the automated assembly system. It is to be appreciated that the conveying apparatus 30, according to the present invention, can be mounted on a stand, if desired, or can be secured directly to the automatic assembly system 2 by conventional mounting brackets.

While the pusher element 48 is described as being operated by a pneumatic cylinder, it is to be appreciated that the pusher element can be operated by an electric motor or any other known or conventional drive mechanism.

In the preferred form of the invention, the conveying apparatus 30, according to the present invention, has a width dimension no greater than about 160 mm. This narrow width of the conveying apparatus 30 facilitates placing a plurality of conveying apparatuses in a side by side relationship adjacent to an access door for an automated assembly system.

According to a preferred form of the invention, the pivot notches 64, supported by the lower surface of the transfer assembly 54, project at an angle of about 4° relative to the side wall and the mating fixed pry surfaces 60 are also provided with a corresponding taper of about 4° relative to the side wall.

Since certain changes may be made in the above described conveying apparatus, without departing from the spirit and scope of the invention herein involved, it is intended that all of the subject matter of the above description or shown in the accompanying drawings shall be interpreted merely as examples illustrating the inventive concept herein and shall not be construed as limiting the invention.

Wherefore, we claim:

1. A conveying apparatus for sequentially feeding a plurality of stacked carrier members, said conveying apparatus comprising:

a first bin for storing a desired quantity of stackable carrier members, said first bin having an outlet for sequentially discharging a carrier member therefrom;

a feed mechanism communicating with said outlet of said first bin, and said feed mechanism facilitating individual feeding of said carrier members, in a sequential manner, from said first bin during use;

a conveyor mechanism communicating with said outlet of said first bin for receiving one carrier member, fed by said feed mechanism, and for conveying said carrier member to an assembly area where a plurality of components can be one of retrieved from said carrier member to manufacture a desired product and loaded on said carrier member for later manufacture of a desired product;

a second bin for collecting each said carrier member returned by said conveyor mechanism from said assembly area, and said second bin having an inlet located adjacent said conveyor mechanism; and a transfer assembly for transferring carrier members from said first bin to said feed mechanism and for transferring each said carrier member, returned by said conveyor mechanism from said assembly area, to the second bin.

2. The conveying apparatus according to claim 1, wherein said transfer assembly has a first carrying surface for receiving a said carrier member from said first bin and facilitating loading of said carrier member onto said conveyor mechanism; and a second surface for facilitating receiving said carrier member returned by said conveyor mechanism and depositing said carrier member in said second bin.

3. The conveying apparatus according to claim 2, wherein said transfer assembly, when in a first position, has said first carrying surface aligned with said conveyor mechanism for conveying said carrier member onto said conveyor mechanism and said transfer assembly, when in a second position, has said second surface of said transfer assembly aligned with said conveyor mechanism for receiving said carrier member returned from said assembly area.

4. The conveying apparatus according to claim 2, wherein said feed mechanism comprises a pusher element which facilitates loading of said carrier member from said first carrying surface of said transfer assembly onto said conveyor mechanism for feeding to said assembly area.

5. The conveying apparatus according to claim 4, wherein a cylinder member is coupled to said pusher element for moving said pusher element in a first direction for feeding the carrier member onto a first section of said conveyor mechanism and, upon completion of a feed cycle, for returning said pusher element back to an initial idle position.

6. The conveying apparatus according to claim 1, wherein said transfer assembly comprises first and second sets of spaced apart movable pivots which cooperate with first and second sets of spaced apart fixed pivots located in said second bin to facilitate transfer of said carrier members.

7. The conveying apparatus according to claim 6, wherein said first set of fixed pivots has a top surface which is horizontally aligned with a conveying surface of said conveyor mechanism and said second set of fixed pivots are located within said second bin and spaced vertically above said first set of fixed pivots; and said first set of movable pivots convey said carrier member from said first bin to said first set of fixed pivots and said second set of movable pivots conveys said carrier member from said first set of fixed pivots to said second set of fixed pivots.

8. The conveying apparatus according to claim 1, wherein said conveyor mechanism comprises at least one endless conveyor belt which rotates about at least first and second return rollers; and a pair of opposed guide rails are provided along at least a portion of said conveyor mechanism to facilitate sandwiching of said carrier member between said guide rails and said at least one conveyor belt to prevent said carrier member from being inadvertently dislodged from said conveyor mechanism.

9. The conveying apparatus according to claim 1, wherein said assembly area of said conveyor mechanism is provided with a stop member.

10. The conveying apparatus according to claim 1, wherein said second bin is located adjacent a first section of said conveyor mechanism for collecting said carrier members in a stacked array for subsequent reuse.

11. The conveying apparatus according to claim 1, wherein said second bin has a door pivotally mounted thereto, said door has a first closed position in which said door facilitates collection of said carrier members and a second pivoted open position in which said door facilitates retrieval of said stacked carrier members from said second bin.

12. The conveying apparatus according to claim 1, wherein said second bin is located directly beneath said first bin, and said transfer assembly communicates with the outlet of said first bin and an inlet of said second bin.

13. The conveying apparatus according to claim 1, wherein said second bin includes an elevator assembly for incrementally lowering a base surface of said second bin each time one of said carrier members is sequentially deposited within the second bin.

14. The conveying apparatus according to claim 1, wherein said second bin includes an elevator assembly for incrementally raising a base surface of said second bin each time one of said carrier members is sequentially removed from said second bin.

15. The conveying apparatus according to claim 1, wherein said carrier member is provided with a plurality of cavities on a top surface thereof, and each of said plurality of cavities is sized to carry a component to be assembled.

* * * * *